(12) United States Patent
Shapiro et al.

(10) Patent No.: US 11,593,535 B2
(45) Date of Patent: Feb. 28, 2023

(54) GEOSPATIALLY REFERENCED BUILDING FLOORPLAN DATA

(71) Applicant: Microsoft Technology Licensing, LLC, Redmond, WA (US)

(72) Inventors: Simon Levi Shapiro, Bellevue, WA (US); David Ross Buerer, Woodinville, WA (US); Peiwei Cao, Bellevue, WA (US); Florin Sabau, Bellevue, WA (US); Jiangbo Zhang, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 665 days.

(21) Appl. No.: 16/672,391

(22) Filed: Nov. 1, 2019

(65) Prior Publication Data
US 2021/0133291 A1    May 6, 2021

(51) Int. Cl.
*G06F 30/13* (2020.01)
*G06Q 10/0631* (2023.01)
(Continued)

(52) U.S. Cl.
CPC ....... *G06F 30/13* (2020.01); *G06Q 10/06313* (2013.01); *G06T 17/10* (2013.01); *G06T 19/003* (2013.01); *G06T 2210/04* (2013.01)

(58) Field of Classification Search
CPC ........ G06F 30/13; G06F 16/29; G06F 16/909; G06F 16/9537; G06F 16/252;
(Continued)

(56) References Cited

U.S. PATENT DOCUMENTS 8,464,181 B1    6/2013   Bailiang et al.
8,965,688 B2 *  2/2015   Bandyopadhyay .... G01C 17/38
                                                   701/1
(Continued)

FOREIGN PATENT DOCUMENTS

EP      2982936 A1 *  2/2016   ............. G06F 16/29
KR   20180109410 A *  10/2018  ............. G06T 17/05

OTHER PUBLICATIONS

Isaac, Mike, "New Version of Google Maps Brings Indoor Floor Plans to Your Phone", Retrieved From https://www.wired.com/2011/11/google-maps-indoor-update/, Nov. 29, 2011, 3 Pages.
(Continued)

*Primary Examiner* — Kandasamy Thangavelu
(74) *Attorney, Agent, or Firm* — Calfee, Halter & Griswold LLP

(57) ABSTRACT

A server system is provided that includes a platform server system configured to store platform map data that is geospatially referenced and includes building outline data for one or more buildings, and provide the platform map data to client computer devices. The server system further includes a tenant bounded server system including one or more processors configured to store building floorplan data for a tenant entity, and provide building floorplan data to client computer devices that are authenticated for the tenant entity. The one or more processors of the tenant bounded server system are further configured to receive a set of building floorplan data for a target building included in the platform map data, determine geospatial reference data for the set of building floorplan data by aligning the set of building floorplan data with building outline data of the target building.

20 Claims, 14 Drawing Sheets

(51) Int. Cl.
*G06T 17/10* (2006.01)
*G06T 19/00* (2011.01)

(58) Field of Classification Search
CPC ............ G06Q 10/06313; G06Q 50/163; G06T 17/10; G06T 19/003; G06T 2210/04; G06T 17/06; G01C 21/383; G06C 17/38; H04W 16/20
See application file for complete search history.

(56) References Cited

U.S. PATENT DOCUMENTS

| | | |
|---|---|---|
| 9,672,656 B1 | 6/2017 | Mcphail |
| 2009/0043504 A1* | 2/2009 | Bandyopadhyay .... G01C 17/38 |
| | | 701/469 |
| 2011/0153190 A1 | 6/2011 | Rolinski et al. |
| 2014/0013263 A1 | 1/2014 | Bailiang et al. |
| 2014/0132640 A1* | 5/2014 | Sharma ................ G01C 21/206 |
| | | 345/661 |
| 2014/0253538 A1 | 9/2014 | Bailiang |
| 2015/0019625 A1 | 1/2015 | Pensack-rinehart et al. |
| 2015/0142391 A1* | 5/2015 | Flynn ................... H04W 16/20 |
| | | 703/1 |
| 2015/0154267 A1* | 6/2015 | Bailiang ............. G06F 16/9537 |
| | | 707/722 |
| 2015/0161819 A1 | 6/2015 | Chen et al. |
| 2016/0005238 A1* | 1/2016 | Bailiang ................. G06T 17/05 |
| | | 345/419 |
| 2016/0102983 A1 | 4/2016 | Javed et al. |
| 2017/0031925 A1* | 2/2017 | Mishra ................... G06T 11/60 |
| 2018/0053274 A1 | 2/2018 | Kendall et al. |
| 2018/0268321 A1 | 9/2018 | Leafty et al. |
| 2021/0409903 A1 | 12/2021 | Shapiro et al. |
| 2022/0240055 A1 | 7/2022 | Shapiro et al. |

OTHER PUBLICATIONS

Liu, et al., "A State-of-the-Art Review on the Integration of Building Information Modeling (BIM) and Geographic Information System (GIS)", In Isprs International Journal of Geo-Information, vol. 6, Issue 2, Feb. 20, 2017, 21 Pages.

"International Search Report and Written Opinion Issued in PCT Application No. PCT/US20/056217", dated Feb. 8, 2021, 12 Pages.

"International Search Report and Written Opinion Issued in PCT Application No. PCT/US2021/028738", dated Aug. 2, 2021, 11 Pages.

"Notice of Allowance Issued in U.S. Appl. No. 16/917,098", dated Dec. 20, 2021, 9 Pages.

* cited by examiner

300

RECEIVING A SET OF BUILDING FLOORPLAN DATA
FOR A TARGET BUILDING INCLUDED IN THE PLATFORM MAP DATA, THE SET OF BUILDING
FLOORPLAN DATA BEING ASSOCIATED WITH THE TENANT ENTITY 302

DETERMINING GEOSPATIAL REFERENCE DATA FOR THE SET OF BUILDING FLOORPLAN
DATA BY ALIGNING THE SET OF BUILDING FLOORPLAN DATA WITH BUILDING OUTLINE DATA
OF THE TARGET BUILDING 304

STORING THE SET OF BUILDING FLOORPLAN DATA AND THE DETERMINED GEOSPATIAL
REFERENCE DATA IN A TENANT BOUNDARY OF THE TENANT ENTITY 306

PROVIDING THE SET OF BUILDING FLOORPLAN DATA AND THE DETERMINED GEOSPATIAL
REFERENCE DATA TO AN AUTHORIZED CLIENT COMPUTER DEVICE 308

FIG. 3

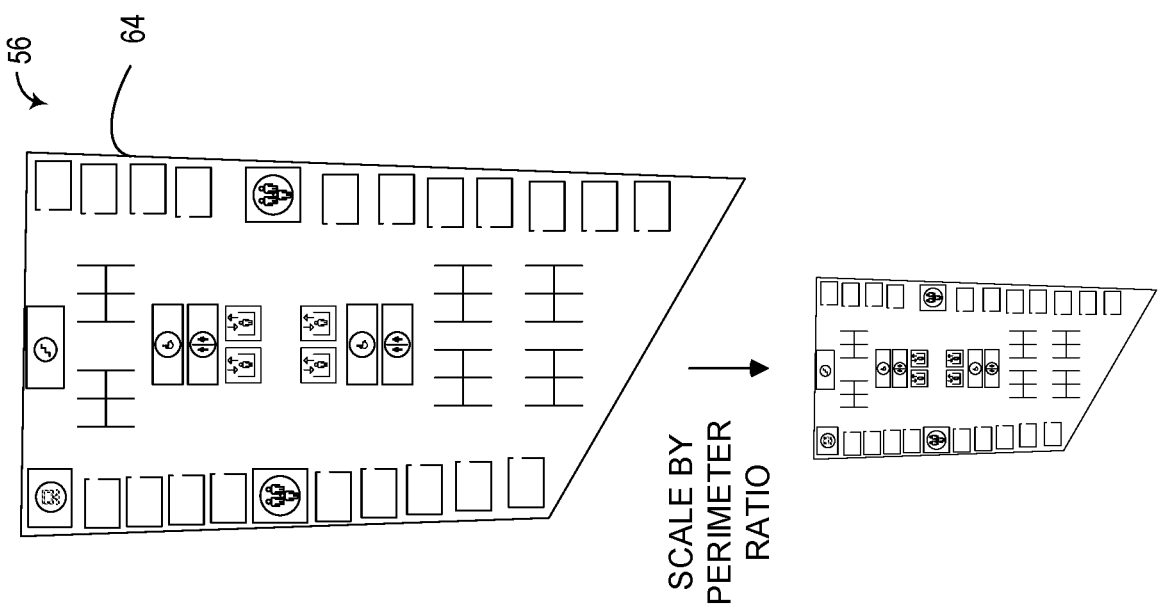
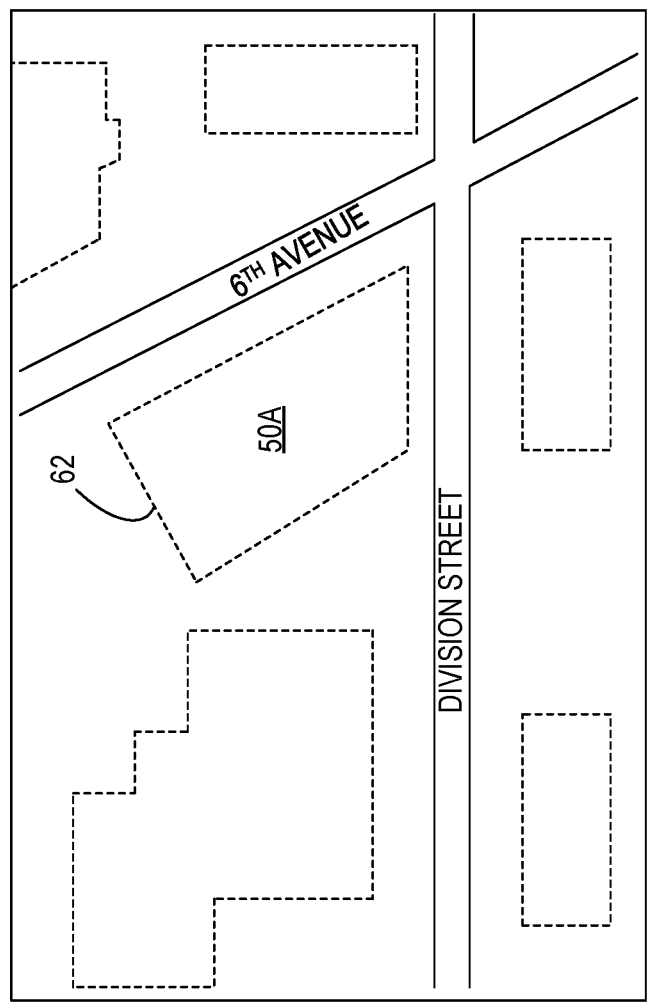
FIG. 6

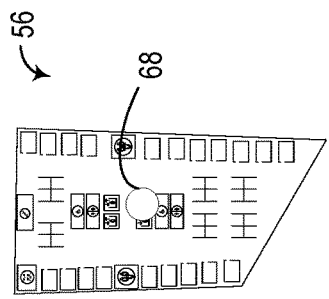
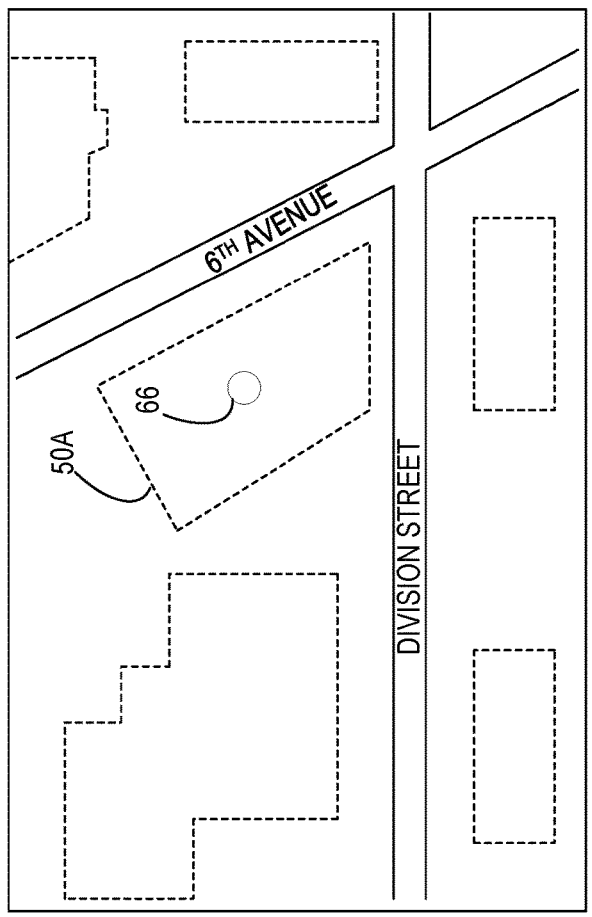
FIG. 7A
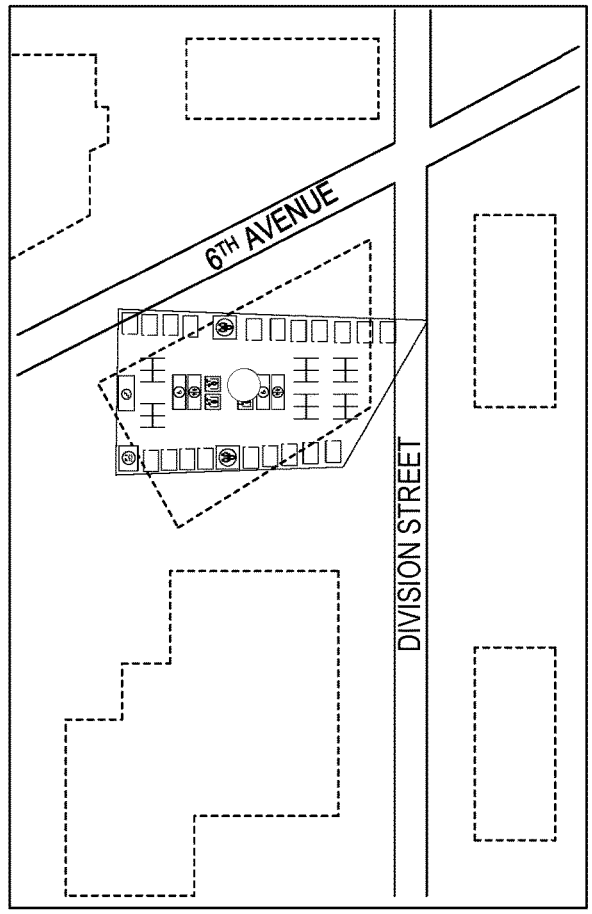
FIG. 7B

1000

DETERMINING ANCHOR POINTS BETWEEN THE BUILDING FLOORPLAN DATA OF THE PLURALITY OF FLOORS 1002

JOINING THE SET OF BUILDING FLOORPLAN DATA OF THE PLURALITY OF FLOORS BASED ON THE DETERMINED ANCHOR POINTS 1004

ALIGNING THE JOINED SET OF BUILDING FLOORPLAN DATA WITH THE BUILDING OUTLINE DATA OF THE TARGET BUILDING 1006

1200

DETERMINING THAT A CLIENT COMPUTER DEVICE IS AUTHORIZED TO ACCESS THE SET OF BUILDING FLOOR PLAN DATA STORED ON TENANT BOUNDED SERVER SYSTEM 1202

SEND THE SET OF BUILDING FLOOR PLAN DATA AND AT LEAST A PORTION OF THE PLATFORM MAP DATA TO THE CLIENT COMPUTER DEVICE TO CAUSE THE CLIENT COMPUTER DEVICE TO PRESENT A MERGED VIEW OF THE SET OF BUILDING FLOORPLAN DATA AND THE PORTION OF PLATFORM MAP DATA 1204

FIG. 12

GEOSPATIALLY REFERENCED BUILDING FLOORPLAN DATA

BACKGROUND

Mapping services typically provide public map data for outdoor areas, such as streets, fields, and the outer perimeter of buildings. However, indoor floorplans for those buildings may be considered confidential to corporate entities who typically do not make their indoor floorplans available to mapping services.

SUMMARY

A server system for geospatially referenced building floorplan data is provided. The server system may include a platform server system including one or more processors configured to execute a platform map service configured to store platform map data that is geospatially referenced and includes building outline data for one or more buildings, and provide the platform map data to client computer devices. The server system may further include a tenant bounded server system including one or more processors configured to store building floorplan data for a tenant entity, and provide building floorplan data to client computer devices that are authenticated for the tenant entity. The one or more processors of the tenant bounded server system may be further configured to receive a set of building floorplan data for a target building included in the platform map data. The set of building floorplan data may be associated with the tenant entity. The one or more processors of the tenant bounded server system may be further configured to determine geospatial reference data for the set of building floorplan data by aligning the set of building floorplan data with building outline data of the target building, and store the set of building floorplan data and the determined geospatial reference data in a tenant boundary of the tenant entity.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3 shows a flowchart of an example method for managing both platform map data and private tenant bounded building floorplan data implemented by the example computer system of FIG. 1.

FIG. 6 shows an example scaling alignment for the method of FIG. 5.

FIG. 7A shows an example centroid used for the translation alignment for the method of FIG. 5.

FIG. 7B shows an example translation alignment using the determined centroids for the method of FIG. 5.

FIG. 12 shows a flowchart of an example method for determining a merged view of the set of building floorplan data and the platform map data implemented by the example computer system of FIG. 1.

DETAILED DESCRIPTION

Mapping services typically provide public map data for outdoor areas, such as streets, fields, and the outer perimeter of buildings. However, indoor floorplans for those buildings may be considered confidential to corporate entities who typically do not make their indoor floorplans available to mapping services. Thus, to enable a mapping service that merges both outdoor and indoor maps, it is important that the storage system of the mapping service guarantees that the data remains within the tenant boundary of those corporate entities. However, displaying the indoor map in the context of an outdoor map, requires the maps to be merged. Guarantees around privacy compliant data storage for indoor maps merged with outdoor maps may potentially be guaranteed by cloning separate instances of an entire mapping technology stack required for maps (rendering, control, geocoding, autosuggest, routing) for every single tenant (which would be incredibly expensive). However, cloning the entire technology stack for maps may potentially increase resource and storage costs on the mapping service for every new entity, which may become prohibitively expensive as the number of entities increases.

Figure 1:
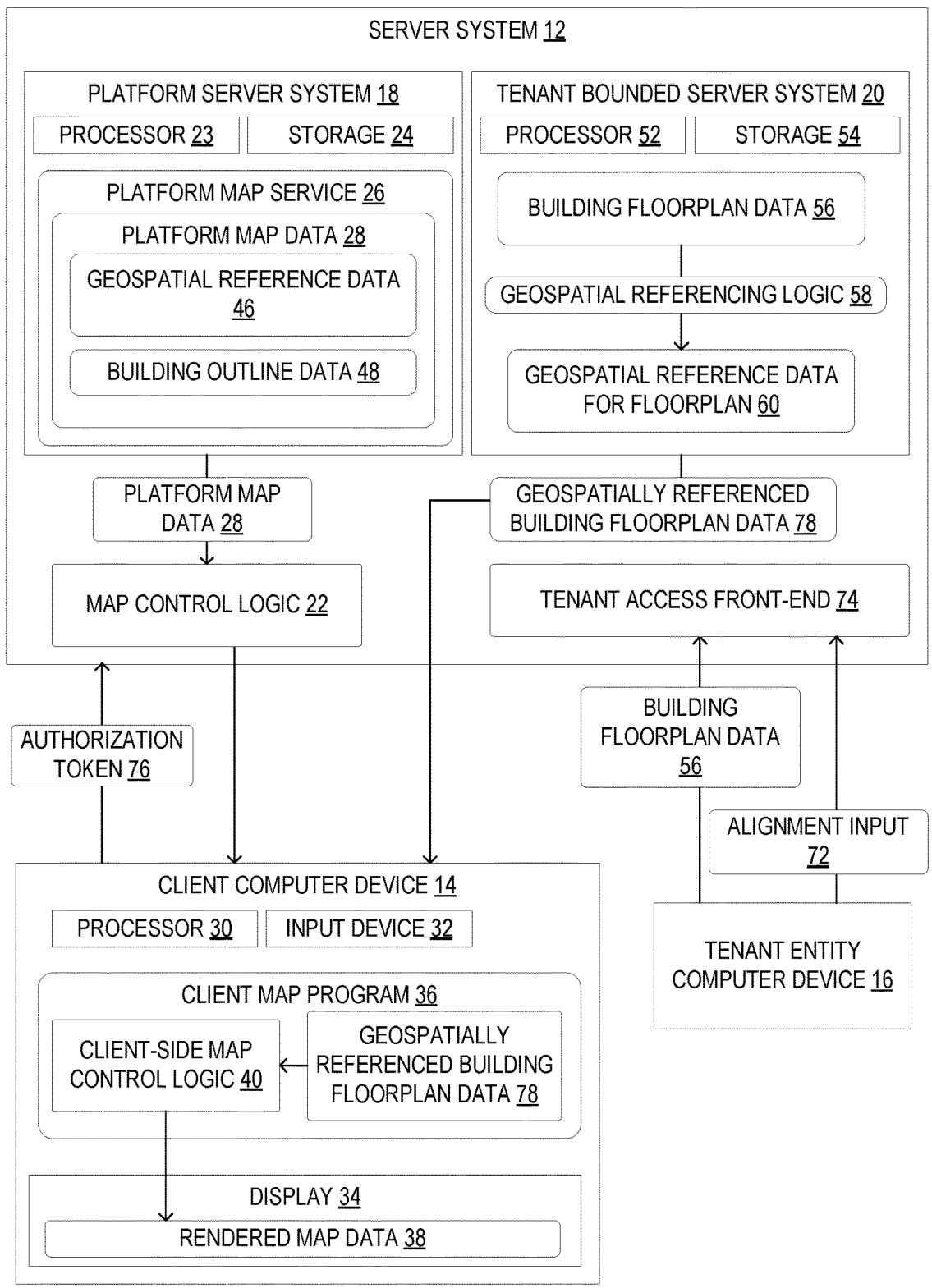
FIG. 1 shows a schematic view of an example computer system for managing both platform map data and private tenant bounded building floorplan data according to one embodiment of the present disclosure.

To address these issues, FIG. 1 illustrates an example computer system 10 for managing both platform map data and private tenant bounded building floor plan data. The computer system 10 includes a server system 12, one or more client computer devices 14, and one or more tenant entity computer devices 16. The server system 12 includes a plurality of server devices that may operate in a cloud computing configuration. For example, the server system 12 may include a platform server system 18 and a tenant bounded server system 20. One or more server devices of the server system 12 may further store map control logic 22 that includes a mapping technology stack including functions such as rendering, control, geocoding, autosuggest, routing, and other mapping service functions. As will be described in more detail below, the map control logic 22 may be sent to the client computer device 14 to locally render and display map data.

The server system 12 may further be configured to handle authentication for the one or more client computer devices 14 and tenant entity computer devices 16 as belonging to a tenant entity or otherwise being authorized to have access to data of the tenant entity stored on the tenant bounded server system 20. As used herein, the term "tenant" refers to an entity, such as a person or organization, that occupies or otherwise controls an area of a building, structure, etc. For example, a tenant entity may be the entity that leases, owns, or occupies a space in a building indicated by a set of building floor plan data. Further, as used herein, the terms "tenant boundary" and "tenant bounded" may refer to server devices or data that requires authorization by a tenant entity to access. That is, users and devices that are authenticated as belonging to the tenant entity or otherwise authorized by the tenant entity may access the tenant bounded server system 20 and/or data stored by the tenant bounded server system 20. It should be appreciated that the tenant bounded server system 20 may include separate tenant boundaries for separate tenant entities, and may implement a suitable data privacy standards and protocols.

As illustrated in FIG. 1, the platform server system 18 includes one or more processors 23, storage devices 24, and other suitable computer components. In one example, the platform server system 18 may include a plurality of server devices configured to operate in a cloud computing configuration to perform that functions of the platform server system 18 described herein. The one or more processors 23 of the platform server system 18 are configured to execute a platform map service 26 configured to store platform map data 28, and provide the platform map data 28 to client computer devices 14.

The client computer devices 14 each include a processor 30, an input device 32 such as a capacitive touch screen, keyboard and mouse, etc., a display 34, and other suitable computer components such as volatile and non-volatile storage devices. The processor 30 of an example client computer device 14 is configured execute a client map program 36 configured to handle client-side user input received via the input device 32, such as map navigation and zoom inputs, and display rendered map data 38 via the display 34. As discussed above, the server system 12 may send the map control logic 22 to the client computer device 14 in response to a user triggering a map experience. The map control logic 22 may be locally executed as client-side map control logic 40 within the client map program 36. In this manner, the client-side map control logic 40 may be configured to perform the functions of the map control logic 22, such as rendering, control, geocoding, autosuggest, routing, and other mapping service functions. It should be appreciated that the client map program 36 may take any suitable form, such as, for example, code executed within a browser, an application program executed on the client computer device 14, etc. As a specific example, the map control logic 22 may be sent to the client computer device 14 in the form of a modified JavaScript Object Notation program, and may further include relevant portions of the platform map data 28 for the user of the client computer device 14. The map control logic 22 may be executed as the client-side map control logic 40 within the client map program 36 which may take the form of a browser program, or an application being executed within a browser program.

Figure 2:
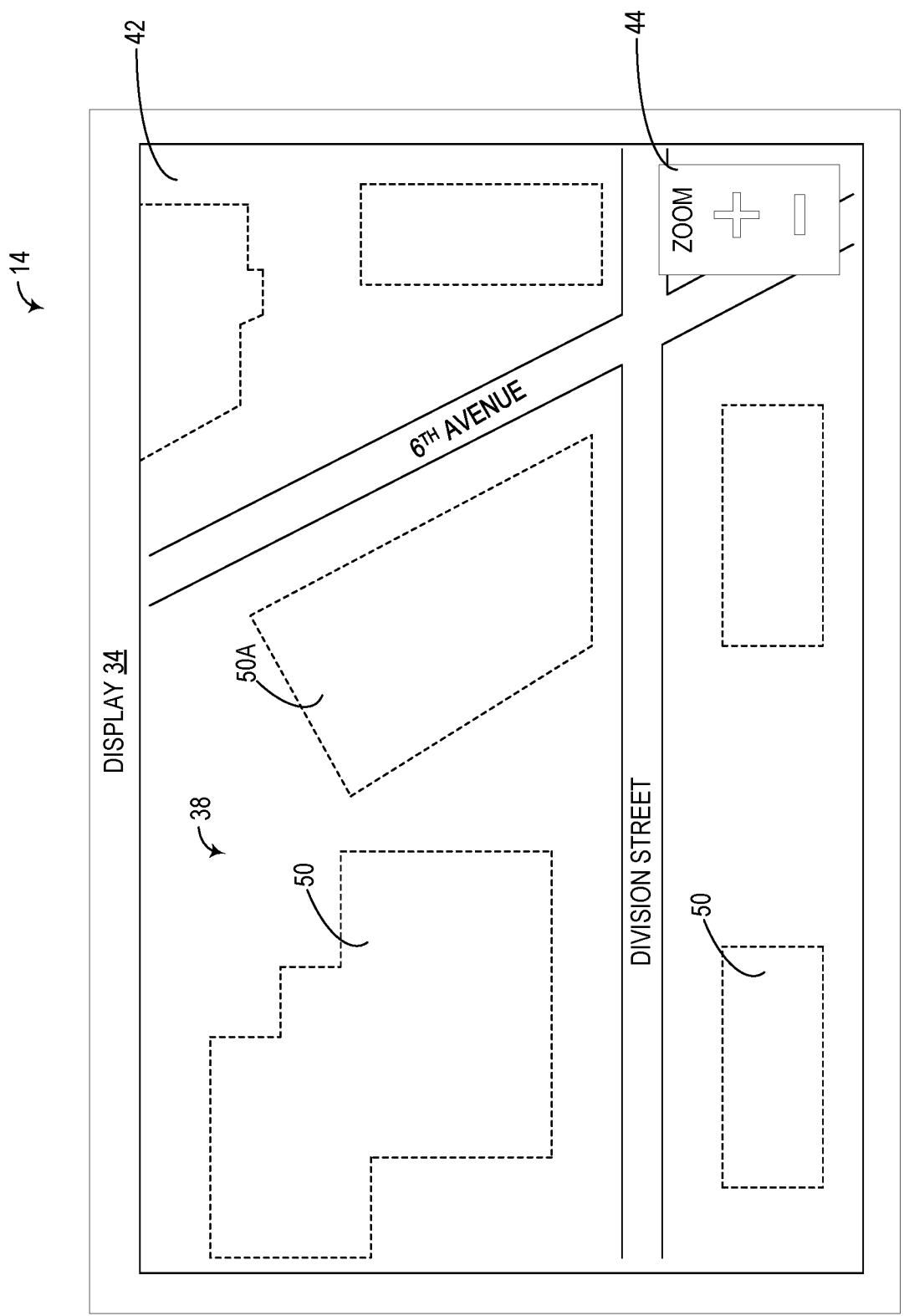
FIG. 2 shows an example graphical user interface of a client map application that is presenting a rendered view of platform map data managed by the example computer system of FIG. 1.

FIG. 2 illustrates an example graphical user interface (GUI) 42 of the client map program 36 being presented via the display 34 of the client computer device 14. The GUI 42 may include a view of the rendered map data 38. The rendered map data 38 may be rendered by the client-side map control logic 40 executed by the client computer device 14. The GUI 42 may also include navigation controls such as, for example, a zoom control 44 that receives a user zoom input. It should be appreciated that the GUI 42 may include other types of navigation controls. Additionally, it should be appreciated that the GUI 42 of the client map program 36 may receive user input via other input modalities. For example, a user may enter a zoom input via a pinching or spreading gesture input to a capacitive touch screen input device. As another example, a user may enter a navigation input via a finger drag gesture input. In a desktop computer example, the user may enter input via a click-and-drag input of a mouse, or by pressing arrow keys on a keyboard. It should be appreciated that the client map program 36 is not limited to the input modalities and techniques described above, and may receive user inputs via any suitable method.

Turning back to FIG. 1, the platform server system 18 is configured to store platform map data 28 that is geospatially referenced. That is, the platform map data 28 may include geospatial reference data 46 for objects in the platform map data 28 that may be used by the map control logic 22 and the corresponding client-side map control logic 40 for geopositioning and rendering map data. In one example, the geospatial reference data 46 may include latitude and longitude values for objects and/or references positions or locations in the platform map data 28. The platform map data 28 may further include building outline data 48 for one or more buildings 50. Example renderings of building outline data 48 for one or more buildings 50 are shown in FIG. 2. The building outline data 48 may include a polygon indicating a perimeter or footprint of each building. The platform map data 28 may further include geospatial reference data 46 for each building outline in the building outline data 48.

When a user of a client computer device 14 triggers an experience for the mapping service, the client map program 36 may call/communicate with the server system 12, and receive map control logic 22 to be executed as client-side map control logic 40 within the client map program 36. For example, the user may trigger a mapping service experience by opening a mapping application on the client computer device, interacting with an electronic meeting invitation that includes directions to the meeting, or another type of user interaction that triggers the mapping service. After triggering the mapping service, the client map program 36 may send an address or coordinates for a location to be displayed to the server system 12. As discussed above, the server system 12 may send the map control logic 22 and the relevant platform map device 28 to the client computer device 14 to cause the client computer device 14 to execute the map control logic 22 as client-side map control logic 40. The client map program 36 may further communicate client-side user inputs to the client-side map control logic 40, such as, for example, navigation inputs, zoom inputs, etc. In some examples, the client-side map control logic 40 may render tiles or areas of the platform map data 28, and the client map program 36 may handle navigation inputs and zoom inputs within the context of the rendered tile or area locally on the client computer device 14.

In one example, the user of the client computer device 14 may trigger an experience for an indoor map for a building that includes building floorplan data. However, as discussed above, building floorplan data may be private and stored within a tenant boundary of the entity that owns the building floorplan data. That is, the indoor floorplan data for a building may be confidential to a tenant entity, such as, for example, a corporate entity. When storing this data, the server system 12 may adhere to relevant privacy regulations and protocols to guarantee that the data remains within a tenant boundary of that tenant entity. However, to display the indoor floorplan data of a building in the context of an outdoor map that is stored separately from the indoor floorplan data, the two sets of data need to be merged while still adhering the privacy protocols. However, cloning separate instances of the entire mapping technology stack maps (e.g. rendering, control, geocoding, autosuggest, routing) implemented by the map control logic 22 for each separate tenant entity may potentially increase resource and storage consumptions, which may become resource expensive as the number of tenant entities increases.

To address these issues, the server system 12 implements a method of geospatially referencing building floorplan data inside of a workflow in the tenant boundaries and storing the geospatially referenced building floorplan data within those tenant boundaries. As illustrated in FIG. 1, the server system 12 includes a tenant bounded server system 20. The tenant bounded server system 20 may include one or more server devices, each server device including one or more processors 52, one or more storage devices 54, and other suitable computer components. In one example, each tenant entity may be assigned respective server devices that are bound to that tenant entity such that data stored on that server device is accessible only by authorized users associated with the tenant entity.

The server system 12 may include authorization protocols to determine whether a client computer device 14 is authorized to access data stored on a server device of the tenant bounded server system 20. For example, the server system 12 may include enterprise accounts that are associated with one or more server devices of the tenant bounded server system 20. In this example, users that are logged into accounts associated with that enterprise may be authorized to access data the associated server device. As another example, the server system 12 may implement authorization protocols such as OAuth 2.0, and may determine whether a user of a client computer device 14 is authorized to access data stored on the tenant bounded server system 20 based on an authorization token received from the client computer device 14. It should be appreciated that the server system 12 may implement other types of authorization techniques and protocols not specifically described above to determine whether particular users and/or client computer devices are authorized by a tenant entity to access data stored with a tenant boundary of that tenant entity.

The tenant bounded server system 20 may be configured to store building floorplan data 56 for a tenant entity, and provide the building floorplan data 56 to client computer devices 14 that are authenticated for the tenant entity, or are otherwise authorized by the tenant entity to access the building floorplan data 56. As illustrated in FIG. 1, the building floorplan data 56 may initially be uploaded to the server system 12 by a tenant entity computer device 16 that is associated with a particular tenant entity. Typically, the building floorplan data 56 is not geospatially referenced within the context of an outdoor map. Thus, the tenant bounded server system 20 may be configured to execute geospatial referencing logic 58 that implements a method illustrated and described with reference to FIGS. 3-9 to perform geospatial referencing of the building floorplan data 56.

FIG. 3 shows a flowchart for a computer-implemented method 300 of geospatially referencing a set of building floorplan data 56. At step 300, the method 300 may include receiving a set of building floorplan data 56 for a target building 50A included in the platform map data 28, the set of building floorplan data 56 being associated with the tenant entity. At 304, the method 300 may include determining geospatial reference data 60 for the set of building floorplan data 56 by aligning the set of building floorplan data 56 with building outline data 48 of the target building 50A. At 306, the method 300 may include storing the set of building floorplan data 56 and the determined geospatial reference data 60 in a tenant boundary of the tenant entity. At 308, the method 300 may include providing the set of building floorplan data 56 and the determined geospatial reference data 60 to an authorized client computer device 308.

Figure 4:
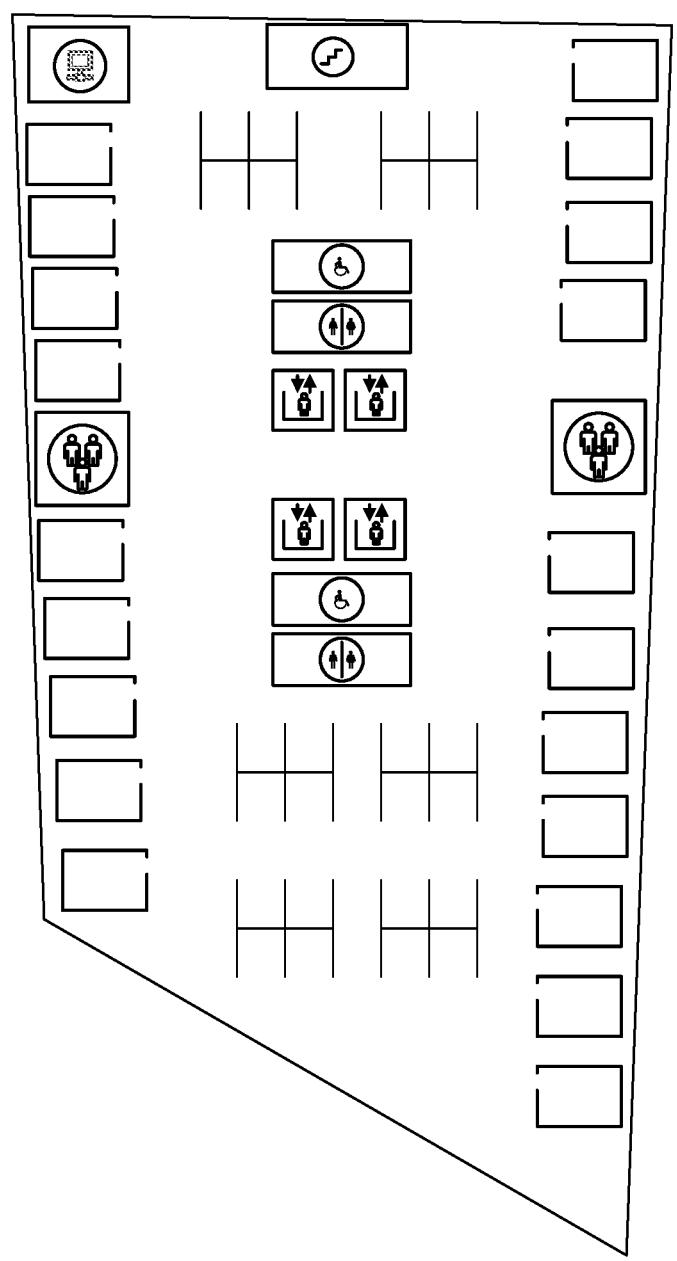
FIG. 4 shows an example set of building floorplan data stored by the example computer system of FIG. 1.

FIG. 4 illustrates an example set of building floorplan data 56 for a target building 50A shown in FIG. 2. The example set of building floorplan data 56 may be received by the tenant bounded server system 20 at step 302 of method 300. In one example, step 302 may further include an identification of the target building 50A associated with the uploaded set of floorplan data. For example, the identification may include an address, geospatial coordinates, or another type of identification of the target building 50A. As discussed above, typically the building floorplan data 56 when initially uploaded to the server system 12 may not be geospatially referenced in the context of an outdoor map. Thus, a server device associated with tenant entity of the tenant bounded server system 20 may be configured to perform step 304 of the method 300 to determine geospatial reference data 60 for the set of building floorplan data 56 by aligning the set of building floorplan data 56 with building outline data 48 of the target building 50A. It should be appreciated that the workflow logic for step 304 is performed within the tenant boundary, and is thus not exposed to the public userbase of the server system 12. The set of floorplan data 56 and associated geospatial reference data 60 may then be stored on storage devices 54 of the tenant bounded server system 20 within the tenant boundary of the associated tenant entity that owns that set of floorplan data 56. Then, using the authorization techniques and protocols described herein, that set of building floorplan data 56 and geospatial reference data 60 may be accessible by authorized users and/or client computer devices 14 such that the set of building floorplan data 56 may be rendered and displayed in the context of the outdoor map from the platform map data 28.

Figure 5:
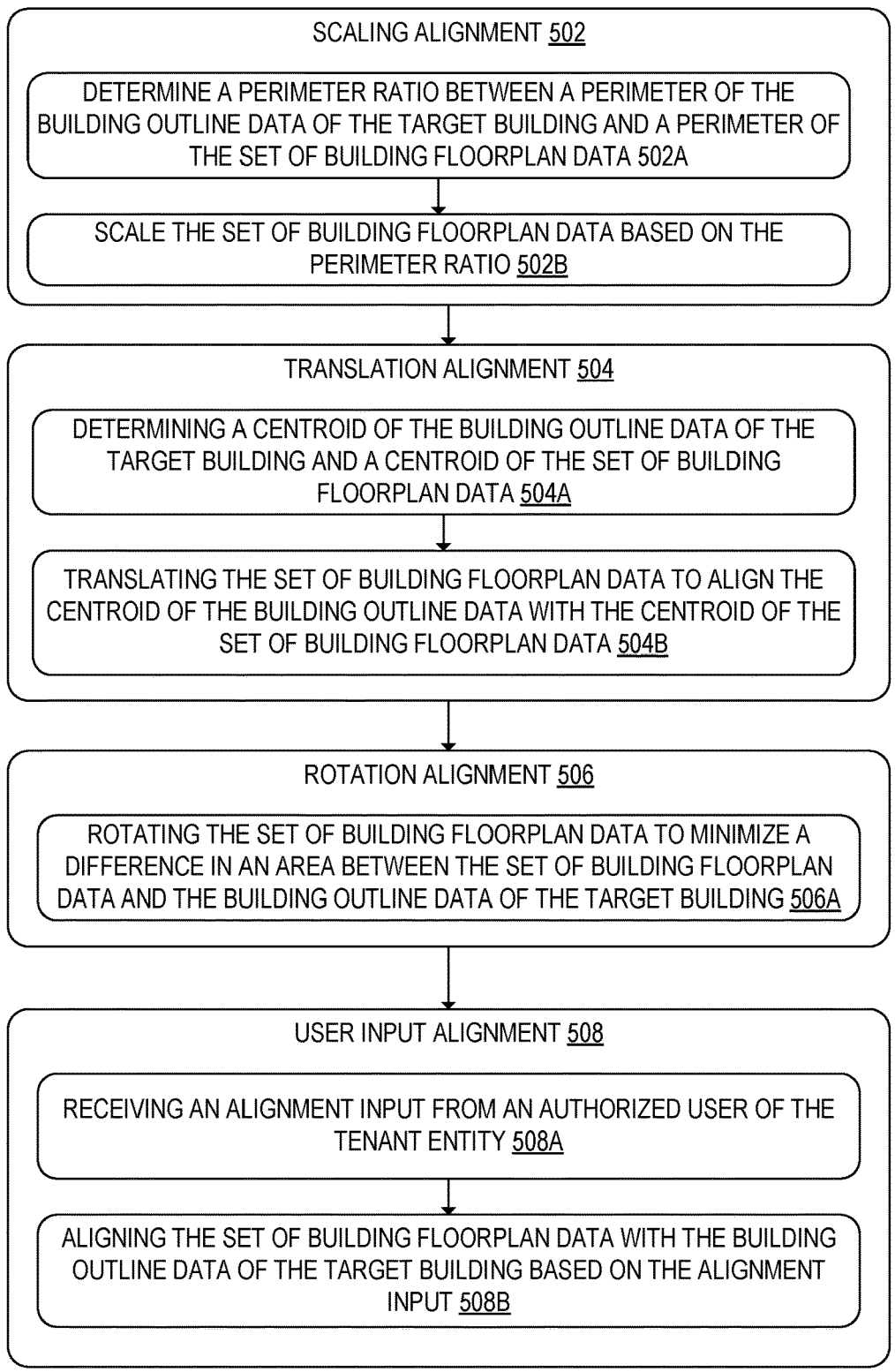
FIG. 5 shows a flowchart of an example method for aligning a set of building floorplan data with a building outline included in platform map data stored by the example computer system of FIG. 1.

In one example, to align the set of building floorplan data 56 with building outline data 48 of the target building 50A at step 304, the tenant bounded server system 20 may implement a computer-implemented method 500 shown in FIG. 5. At step 502, the method 500 may include a scaling alignment step. At step 504, the method 500 may include a translation alignment step. At step 506, the method 500 may include a rotation alignment step. At 508, the method 500 may include a user input alignment step. Each step 502-508 may include the sub-steps shown in the flowchart of FIG. 5.

Step 502 may include sub-steps 502A and 502B. At step 502A, the method 500 may include determining a perimeter ratio between a perimeter of the building outline data 48 of the target building 50A and a perimeter of the set of building floorplan data 56. At step 502B, the method 500 may include scaling the set of building floorplan data based on the perimeter ratio.

FIG. 6 illustrates an example of scaling a set of building floorplan data 56. As shown, the tenant bounded server system 20 may be configured to, within the tenant boundary, to determine a perimeter 62 of a polygon representing the building outline of the target building 50A based on the building outline data 48. Next, the tenant bounded server system 20 may be further configured to determine a perimeter 64 of a polygon representing the outline of the set of building floorplan data 56. The tenant bounded server system 20 may then determine a perimeter ratio between the perimeter 62 of the building outline data 48 of the target building 50A and a perimeter 64 of the set of building floorplan data 56. Using the determined perimeter ratio, the tenant bounded server system 20 may be configured to scale the set of building floorplan data 48 such that the set of building floorplan data 56 has a substantially equal value for the perimeter as the building outline data 48 of the target building 50A.

Step 504 may include sub-steps 504A and 504B. At step 504A, the method 500 may include determining a centroid of the building outline data 48 of the target building 50A and a centroid of the set of building floorplan data 56. At step 504B, the method 500 may include translating the set of building floorplan data 56 to align the centroid of the building outline data 48 of the target building 50A with the centroid of the set of building floorplan data 56.

FIGS. 7A and 7B illustrate an example of translating a set of building floorplan data 56. As shown, the tenant bounded server system 20 may be configured to determine a centroid 66 of a polygon representing the building outline data 48 for the target building 50A. The tenant bounded server system 20 may further determine a centroid 68 of a polygon representing an outside perimeter of the set of building floorplan data 56. These centroids may be determined via any suitable technique. As shown in FIG. 7B, after determining the centroids 66 and 68, the tenant bounded server system 20 may be configured to translate the set of building floorplan data 56 to align the two centroids 66 and 68 to overlap each other.

Step 506 may include sub-step 506A. At 506A, the method 500 may include rotating the set of building floorplan data 56 to minimize a difference in an area between the set of building floorplan data 56 and the building outline data 48 of the target building 50A.

Figures 8A, 8B:
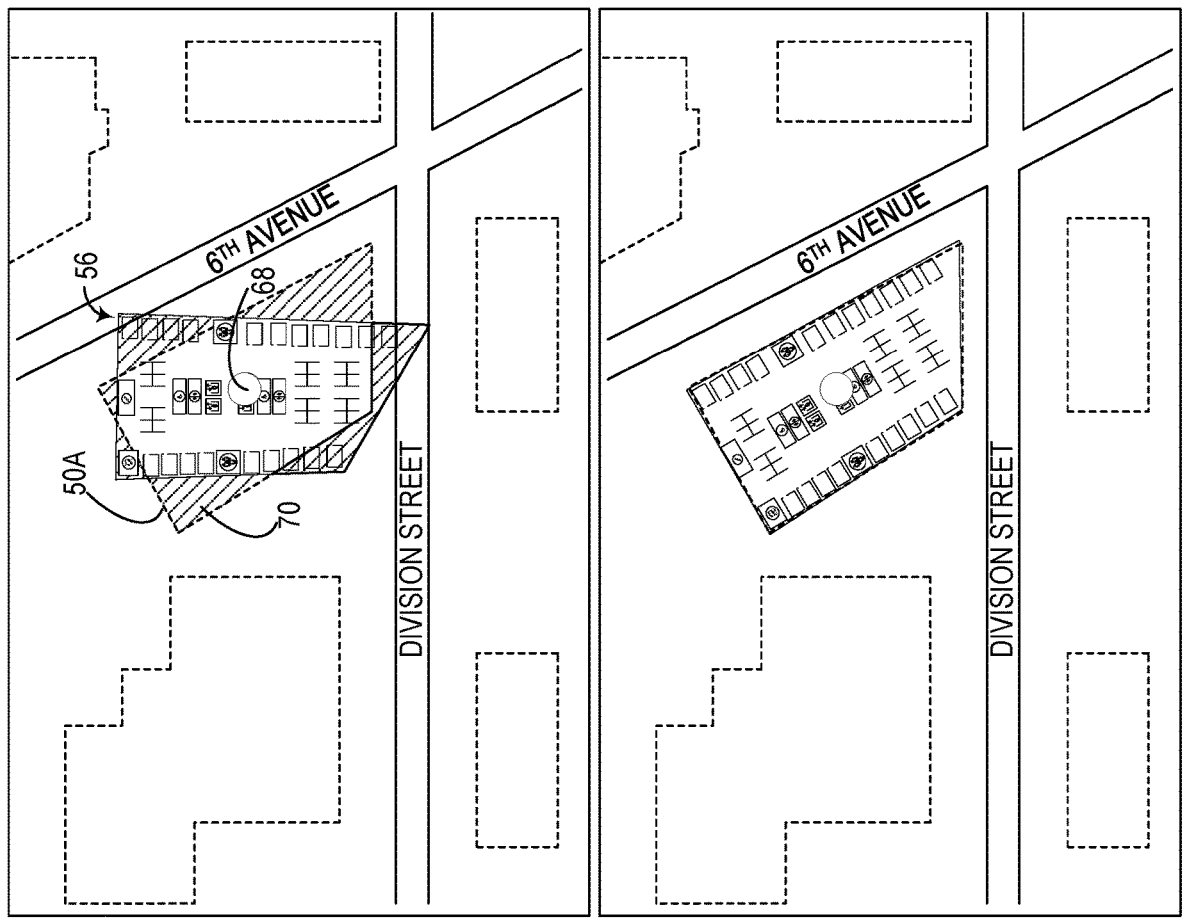
FIG. 8A shows an example area difference between the set of building floorplan data and the building outline data for performing rotation alignment for the method of FIG. 5.
FIG. 8B shows an example rotation alignment by minimizing the area difference for the method of FIG. 5.

FIGS. 8A and 8B illustrate an example of rotating a set of building floorplan data 56. As shown, the tenant bounded server system 20 may be configured to compare an area of a polygon representing the building outline data 48 of the target building 50A to a polygon representing an outside perimeter of the set of building floorplan data 56. FIG. 8A illustrates a difference 70 (shown as shaded regions) in the area between the set of building floorplan data 56 and the building outline data 48 of the target building 50A based on an initial orientation of the set of building floorplan data 56. The tenant bounded server system 20 may be configured to rotate the orientation of the set of building floorplan data 56 about the centroid 68 to minimize the difference 70 in area. FIG. 8B shows an example result of this rotation alignment.

In one example, after programmatically performing steps 502-506, the set of building floorplan data 56 may potentially be misaligned with the building outline data 48 of the target building 50A. This misalignment may occur due to several different reasons. For example, the building outline data 48 for the target building 50A of the platform map data 28 may be simplified or potentially erroneous, and thus may not match the corresponding set of building floorplan data 56 which typically may be more detailed and accurate. As another example, the tenant entity associated with the building floorplan data 56 may only occupy a portion of a floor in the target building 50A. Thus, the building floorplan data 56 may only include data for a portion of a floor, and thus a perimeter of that building floorplan data 56 may not match an outside perimeter of the building. In these scenarios, aligning the set of building floorplan data 56 with the building outline data 48 of the target building may potentially be incorrect.

To address this issue, the tenant bounded server system 20 implementing method 500 may be further configured to implement step 508 of the method 500. Step 508 may include sub-steps 508A and 508B. At 508A, the method 500 may include receiving an alignment input 72 from an authorized user of the tenant entity. At step 508B, the method 500 may include aligning the set of building floorplan data 56 with the building outline data 48 of the target building 50A based on the alignment input 72.

As illustrated in FIG. 1, the server system 12 may include a tenant access front-end 74 executed by one or more server devices of the server system 12, such as, for example, one or more server devices of the tenant bounded server system 20. The tenant access front-end 74 may provide a GUI via which a user of the tenant entity computer device 16 may be authenticated. For example, the user of the tenant entity computer device 16 may log-into an enterprise account for the associated tenant entity, or may otherwise be authenticated by tenant access front-end 74. In one example, the set of building floorplan data 56 may be uploaded via the tenant access-front end 74.

As shown in FIG. 1, the user authorized user of the tenant entity computer device 16 may send an alignment inputs 72 to the tenant access front-end 74. For example, the tenant access front-end 74 may include a GUI via which the user of the tenant entity computer device 16 may interact with the set of building floorplan data 56 to manually align the set of building floorplan data 56 with the building outline data 48 of the target building 50A.

Figure 9:
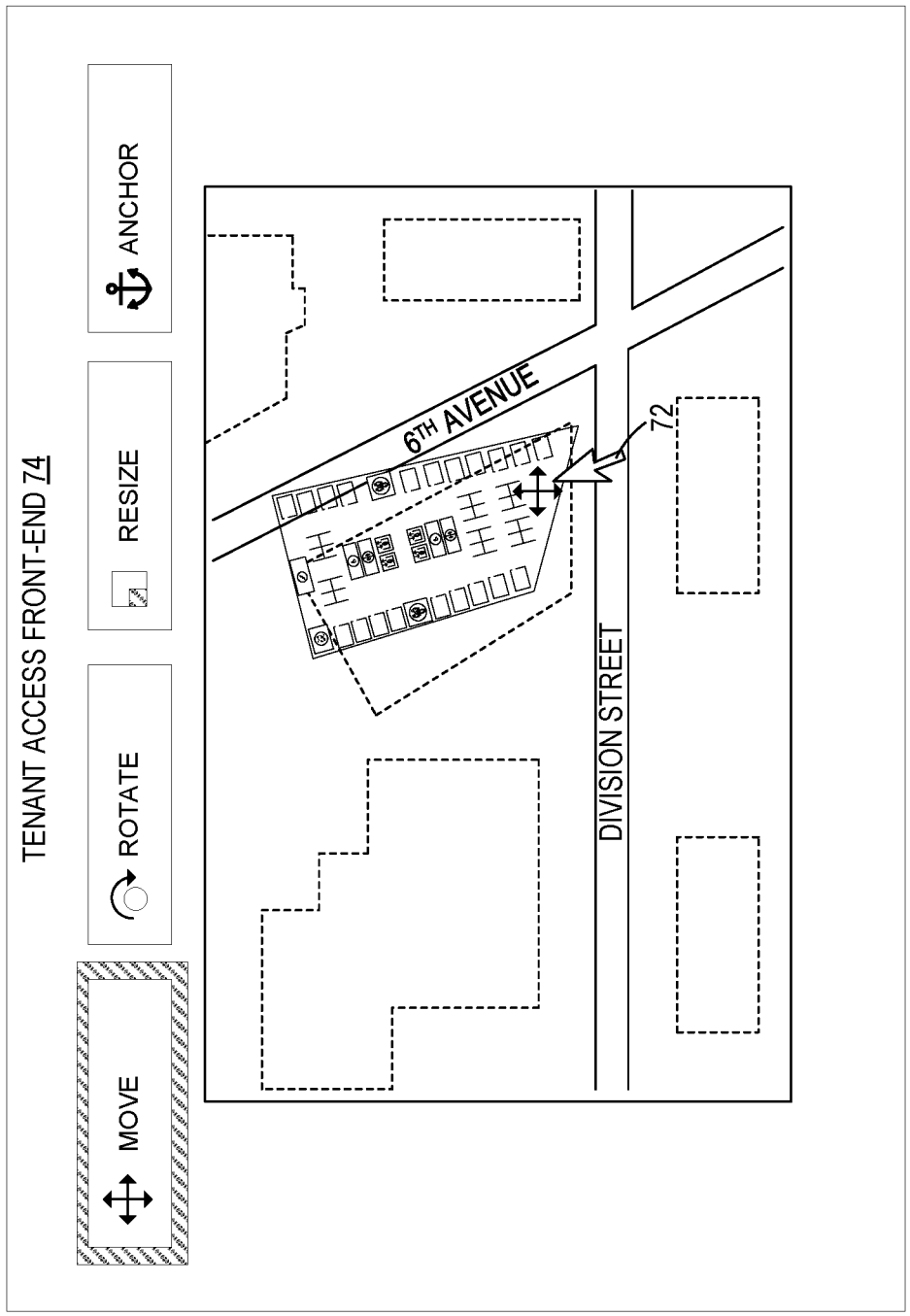
FIG. 9 shows an example graphical user interface for receiving alignment input from a user for the method of FIG. 5.

FIG. 9 shows an example GUI for the tenant access front-end 74 being displayed via a display of the tenant entity computer device 16. As shown, the GUI may include several tools include a move tool, a rotate tool, a resize tool, and an anchor tool. The move tool is current selected by the user, and may be used to manually perform a translation alignment. Further in this example, the resize tool may be used to manually perform a scaling alignment, and the rotate tool may be used to manually perform a rotation alignment. The anchor tool may be used to identify anchor points between a plurality of floors in a set of multiple floor plans, which will be described in more detail below. Using these tools of the GUI, the authorized user may enter alignment inputs 72 to the GUI of the tenant access front-end 74. The tenant bounded server system 20 may then align the set of building floorplan data 56 further based on these alignment inputs 72 received from the authorized user of the tenant entity computer device 16.

In one example, the set of building floorplan data 56 may include building floorplan data for a plurality of floors. That is, the tenant entity may occupy multiple floors in a building, and may uploaded building floorplan data 56 for each of those floors. In one example, the tenant bounded server system 20 may separately align floorplan data for each of the floors to the building outline data 48 of the target building 50A. In another example, the tenant bounded server system

Figure 10:
FIG. 10 shows a flowchart of an example method for determining anchor points in a set of building floorplan data implemented by the example computer system of FIG. 1.

20 may be configured to determine a join between the building floorplan data 56 for each floor. To determine the join of the set, the tenant bounded server system 20 may be configured to implement the method 1000 shown in FIG. 10. In one example, the method 1000 may be performed by the method 500, and the entire joined set of the building floorplan data 56 may be aligned according to the method 500.

Method 1000 may include steps 1002-1006. At 1002, the method 1000 may include determining anchor points between the building floorplan data of the plurality of floors. At 1004, the method 1000 may include joining the set of building floorplan data of the plurality of floors based on the determined anchor points. At 1006, the method 1000 may include aligning the joined set of building floorplan data with the building outline data of the target building.

Figure 11:
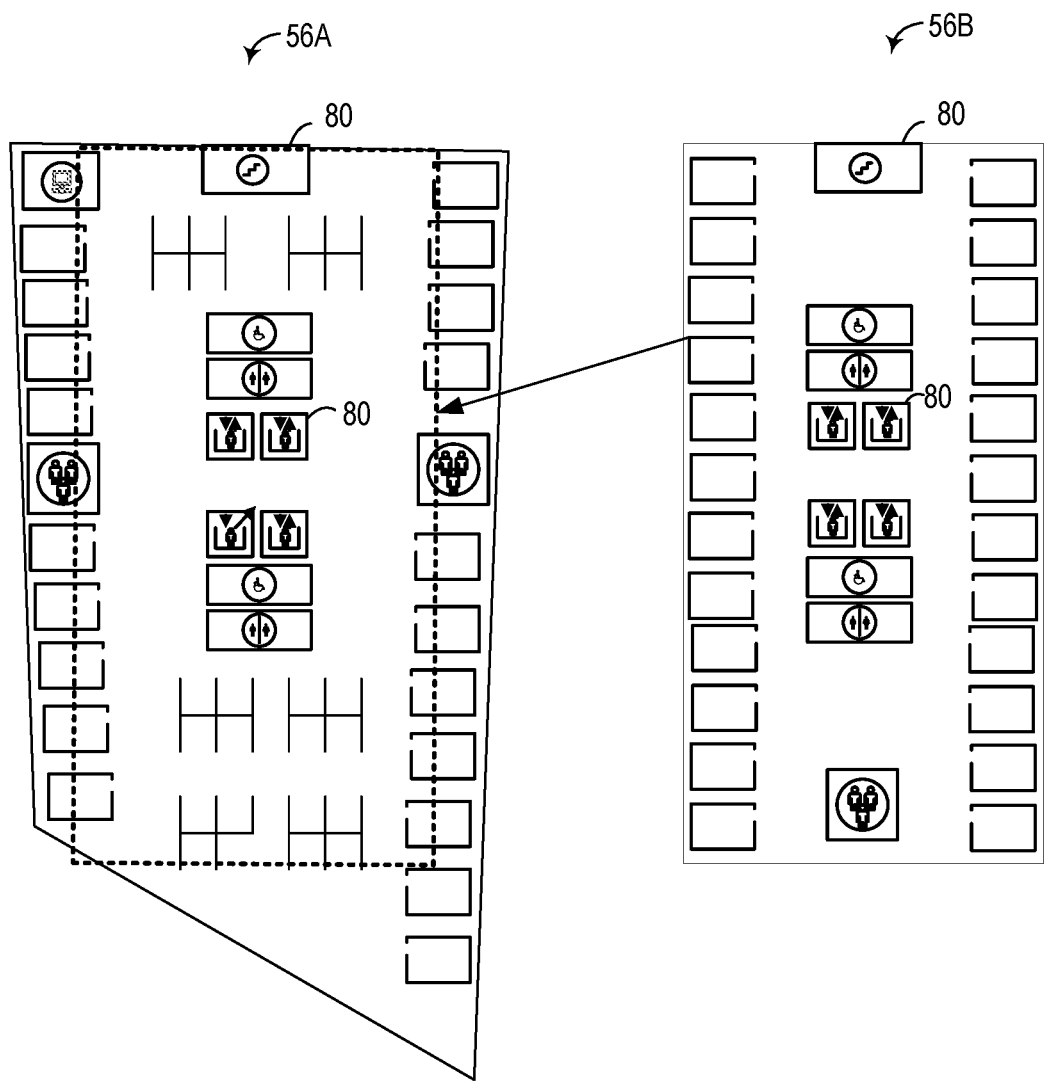
FIG. 11 shows an example set of building floorplan data and identified anchor points for the method of FIG. 10.

FIG. 11 shows an example of building floorplan data 56A and 56B for two different floors in a building occupied by a tenant entity. As shown, the first building floorplan data 56A for a first floor is different from the second building floorplan data 56B for a second floor. To align the first and second building floorplan data 56A and 56B relative to each other, the tenant bounded server system 20 may be configured to determine one or more anchor points 80. The anchor points 80 may, for example, be objects that travel vertically through the building, and may thus be used to align the building floorplan data on top of each other. For example, the anchor points 80 may be determined based on identifying elevators or stairs in the set of building floor plan data 56, as elevators and stairs typically extend vertically in a building through each floor. However, it should be appreciated that other types of anchor points may be identified, such as, for example, a support pillar that extends vertically through the building, a fire escape ladder, etc.

In one example, the anchor points 80 may be determined by identifying symbols or words in the building floorplan data 56 that indicate an elevator, stairs, or other type of anchor point. In the example illustrated in FIG. 11, the anchor points 80 may be determined based on programmatically identifying the symbols used for the elevator and the stairs. In this example, the tenant bounded server system 20 may be configured to perform visual processing on the building floorplan data 56 to identify these symbols. In another example, the building floorplan data 56 may include text that identifies different objects in the floorplan. Accordingly, the tenant bounded server system 20 may be configured to perform text processing on the building floorplan data 56 to identify the terms "elevator", "stairs", or other objects being used as anchor points. In yet another example, the anchor points may be manually identified by an authorized user via the GUI of the tenant access front-end 74 shown in FIG. 9 using the anchor tool. For example, the authorized user may manually select an anchor point in the floorplan data for each floor.

After determining the anchor points 80, each of the building floorplan data 56A and 56B in the set may be joined by those anchor points. The joined set of building floorplan data 56 may then be used together to be aligned with the building outline data of the target building according to the techniques described with reference to FIG. 5.

After the set of building floorplan data 56 has been aligned to the building outline data 48 of the target building 50A, the tenant bounded server system 20 may be configured to determine geospatial reference data 60 for the set of building floorplan data 56. For example, the geospatial reference data 60 for the set of building floorplan data 56 may be determined relative to the already known geospatial reference data 46 for the building outline data 48 of the target building 50A stored by the platform map data 28. The set of building floorplan data 56 and the geospatial reference data 60 for the floorplan data may then be stored on the tenant bounded server system 20. It should be appreciated the methods and techniques for aligning the set of building floorplan data 56 and determining geospatial reference data 60 is performed within the tenant boundary of the associated tenant entity on the tenant bounded server system 20. Thus, the tenant entity's private data is not exposed to other devices on the server system 12.

In response to a mapping request from a client device that is authorized for the tenant entity, the geospatially referenced building floorplan data 78 may be sent to the client computer device 14 that has been authorized to view that data. Additionally, the map control logic 22 and the relevant portions of the platform map data 28 are also sent to the client computer device 14. The server system 12 may implement the method 1200 shown in FIG. 12 to cause the client computer device 14 to present a merged view of the indoor and outdoor map data.

Method 1200 may include steps 1202 and 1204. At 1202, the method 1200 may include determining that a client computer device is authorized to access the set of building floor plan data stored on tenant bounded server system. In the example illustrated in FIG. 1, the client computer device 14 may be configured to send an authorization token 76 to the server system 12. However, it should be appreciated that the client computer device 14 may be authorized using other techniques, such as, for example, a log-in to an enterprise account of the tenant entity on the server system 12.

When a user of the client computer device 14 triggers an experience where the set of building floorplan data may be shown, the client computer device 14 may send a request to the server system 12, which is configured to send the map control logic 22 and at least a portion of the platform map data 28 to the client computer device 14, which may be configured to execute the received map control logic 22 as the client-side map control logic 40 to present rendered map data 38 via a display 34 of the client computer device 14. During this process, the geospatially referenced building floorplan data 78 may also be retrieved from the tenant bounded server system 20, contingent on the client computer device 14 being authorized to access that data.

Figure 13:
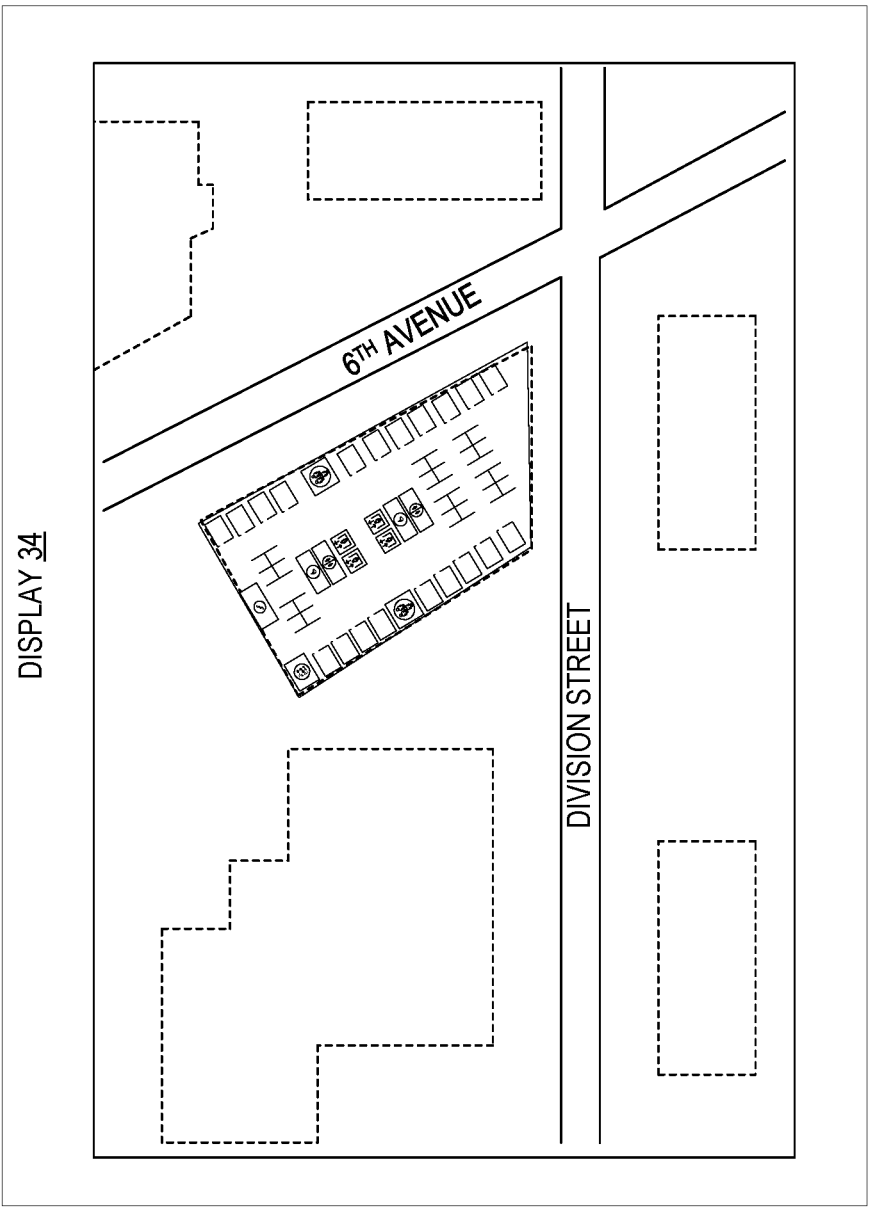
FIG. 13 shows an example merged view of the set of building floorplan data and the platform map data shown by a client computer device of the example computer system of FIG. 1.

After retrieving the geospatially referenced building floorplan data 78, the method 1200 may further include step 1204, and may include sending the set of building floor plan data 78 and at least a portion of the platform map data 28 to the client computer device 14 to cause the client computer device 14 to present a merged view of the set of building floorplan data 56 and the portion of platform map data 28. FIG. 13 illustrates an example merged view 82 of the set of building floorplan data 56 and the platform map data 28. As shown, the set of building floorplan data 56 is displayed in the context of the outdoor map from the platform map data.

According to the techniques and methods described above, building floorplan data may be geospatially referenced inside the workflow in the tenant boundaries specified by a tenant entity that controls the data. Further, that data may be stored within those tenant boundaries, and merged with outdoor map data stored on a mapping platform for users that are authorized by that tenant entity to view the data. Additionally, the merged view of the map data may be generated without requiring the entire mapping technology stack (e.g. rendering, control, geocoding, autosuggest, routing) to be duplicated for each tenant, while nonetheless providing guarantees around privacy compliant data storage for the building floorplan data of each tenant entity.

Additionally, it should be appreciated that while the above disclosure is described with reference to one tenant entity, the server system 12 may be configured to store data for multiple different tenant entities. That is, a plurality of sets of building floorplan data 56 may be stored for a plurality of different tenant entities having separate tenant boundaries. Further, in one example, a single user may be authorized for more than one tenant entity, and may access the building floorplan data 56 for multiple tenant entities. In this example, the server system 12 may be configured to determine a plurality of tenant entities that a user of the client computer device 14 is authorized for, and may retrieve building floorplan data 56 for each of those plurality of tenant entities. The client-side map control logic 40 and client map program 36 may then be configured to generate a merged view that includes each of the building floorplan data 56 from the plurality of tenant entities and the outdoor map data of the platform map data 28.

In some embodiments, the methods and processes described herein may be tied to a computing system of one or more computing devices. In particular, such methods and processes may be implemented as a computer-application program or service, an application-programming interface (API), a library, and/or other computer-program product.

Figure 14:
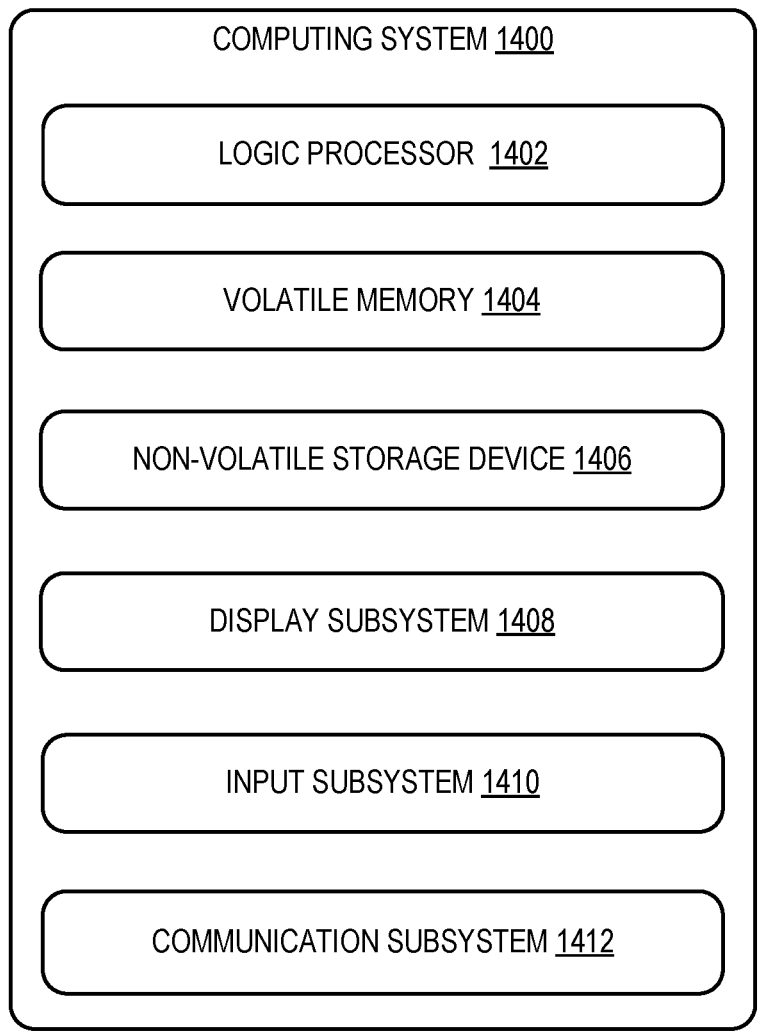
FIG. 14 shows a schematic view of an example computing environment in which the computer system of FIG. 1 may be enacted.

FIG. 14 schematically shows a non-limiting embodiment of a computing system 1400 that can enact one or more of the methods and processes described above. Computing system 1400 is shown in simplified form. Computing system 1400 may embody one or more client computer devices 14, tenant computer devices 16, and one or more server devices of the server system 12 described above and illustrated in FIG. 1. Computing system 1400 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 1400 includes a logic processor 1402 volatile memory 1404, and a non-volatile storage device 1406. Computing system 1400 may optionally include a display subsystem 1408, input subsystem 1410, communication subsystem 1412, and/or other components not shown in FIG. 14.

Logic processor 1402 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 1402 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 1406 includes one or more physical devices configured to hold instructions executable by the logic processors to implement the methods and processes described herein. When such methods and processes are implemented, the state of non-volatile storage device 1406 may be transformed—e.g., to hold different data.

Non-volatile storage device 1406 may include physical devices that are removable and/or built-in. Non-volatile storage device 1406 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1406 may include nonvolatile, dynamic, static, read/write, read-only, sequential-access, location-addressable, file-addressable, and/or content-addressable devices. It will be appreciated that non-volatile storage device 1406 is configured to hold instructions even when power is cut to the non-volatile storage device 1406.

Volatile memory 1404 may include physical devices that include random access memory. Volatile memory 1404 is typically utilized by logic processor 1402 to temporarily store information during processing of software instructions. It will be appreciated that volatile memory 1404 typically does not continue to store instructions when power is cut to the volatile memory 1404.

Aspects of logic processor 1402, volatile memory 1404, and non-volatile storage device 1406 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 1400 typically implemented in software by a processor to perform a particular function using portions of volatile memory, which function involves transformative processing that specially configures the processor to perform the function. Thus, a module, program, or engine may be instantiated via logic processor 1402 executing instructions held by non-volatile storage device 1406, using portions of volatile memory 1404. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 1408 may be used to present a visual representation of data held by non-volatile storage device 1406. The visual representation may take the form of a graphical user interface (GUI). As the herein described methods and processes change the data held by the non-volatile storage device, and thus transform the state of the non-volatile storage device, the state of display subsystem 1408 may likewise be transformed to visually represent changes in the underlying data. Display subsystem 1408 may include one or more display devices utilizing virtually any type of technology. Such display devices may be combined with logic processor 1402, volatile memory 1404, and/or non-volatile storage device 1406 in a shared enclosure, or such display devices may be peripheral display devices.

When included, input subsystem 1410 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 1412 may be configured to communicatively couple various computing devices described herein with each other, and with other devices. Communication subsystem 1412 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 1400 to send and/or receive messages to and/or from other devices via a network such as the Internet.

The following paragraphs provide additional support for the claims of the subject application. One aspect provides a server system comprising a platform server system including one or more processors configured to execute a platform map service configured to store platform map data that is geospatially referenced and includes building outline data for one or more buildings, and provide the platform map data to client computer devices. The server system further comprises a tenant bounded server system including one or more processors configured to store building floorplan data for a tenant entity, and provide building floorplan data to client computer devices that are authenticated for the tenant entity. The one or more processors of the tenant bounded server system are further configured to receive a set of building floorplan data for a target building included in the platform map data. The set of building floorplan data is associated with the tenant entity. The one or more processors of the tenant bounded server system are further configured to determine geospatial reference data for the set of building floorplan data by aligning the set of building floorplan data with building outline data of the target building, and store the set of building floorplan data and the determined geospatial reference data in a tenant boundary of the tenant entity. In this aspect, additionally or alternatively, to align the set of building floorplan data with the building outline data of the target building, the one or more processors of the tenant bounded server system may be further configured to determine a centroid of the building outline data of the target building and a centroid of the set of building floorplan data, and translate the set of building floorplan data to align the centroid of the set of building floorplan data with the centroid of the building outline data of the target building. In this aspect, additionally or alternatively, to align the set of building floorplan data with the building outline data of the target building, the one or more processors of the tenant bounded server system may be further configured to determine a perimeter ratio between a perimeter of the building outline data of the target building and a perimeter of the set of building floorplan data, and scale the set of building floorplan data based on the perimeter ratio. In this aspect, additionally or alternatively, to align the set of building floorplan data with the building outline data of the target building, the one or more processors of the tenant bounded server system may be further configured to rotate the set of building floorplan data to minimize a difference in an area between the set of building floorplan data and the building outline data of the target building. In this aspect, additionally or alternatively, the set of building floorplan data may include building floorplan data for a plurality of floors. In this aspect, additionally or alternatively, to align the set of building floorplan data with the building outline data of the target building, the one or more processors of the tenant bounded server system may be further configured to determine anchor points between the building floorplan data of the plurality of floors, join the set of building floorplan data of the plurality of floors based on the determined anchor points, and align the joined set of building floorplan data with the building outline data of the target building. In this aspect, additionally or alternatively, the anchor points may be determined based on identifying elevators or stairs in the set of building floor plan data. In this aspect, additionally or alternatively, to align the set of building floorplan data with the building outline data of the target building, the one or more processors of the tenant bounded server system may be further configured to receive an alignment input from an authorized user of the tenant entity, and align the set of floorplan outline data with the building outline data of the target building based on the alignment input. In this aspect, additionally or alternatively, the alignment input may be selected from the group consisting of a translation alignment, a scaling alignment, and a rotation alignment. In this aspect, additionally or alternatively, a processor of the server system may be configured to determine that a client computer device is authorized to access the set of building floor plan data stored on tenant bounded server system, and send the set of building floor plan data and at least a portion of the platform map data to the client computer device to cause the client computer device to present a merged view of the set of building floorplan data and the portion of platform map data.

Another aspect provides a method comprising, at one or more processors of a platform server system, executing a platform map service configured to store platform map data that is geospatially referenced and includes building outline data for one or more buildings, and providing the platform map data to client computer devices. The method further comprises, at one or more processors of a tenant bounded server system, storing building floorplan data for a tenant entity, and providing the building floorplan data to client computer devices that are authenticated for the tenant entity. The method further comprises, at one or more processors of a tenant bounded server system, receiving a set of building floorplan data for a target building included in the platform map data. The set of building floorplan data is associated with the tenant entity. The method further comprises determining geospatial reference data for the set of building floorplan data by aligning the set of building floorplan data with building outline data of the target building, and storing the set of building floorplan data and the determined geospatial reference data in a tenant boundary of the tenant entity. In this aspect, additionally or alternatively, aligning the set of building floorplan data with the building outline data of the target building may further comprise determining a centroid of the building outline data of the target building and a centroid of the set of building floorplan data, and translating the set of building floorplan data to align the centroid of the set of building floorplan data with the centroid of the building outline data of the target building. In this aspect, additionally or alternatively, aligning the set of building floorplan data with the building outline data of the target building may further comprise determining a perimeter ratio between a perimeter of the building outline data of the target building and a perimeter of the set of building floorplan data, and scaling the set of building floorplan data based on the perimeter ratio. In this aspect, additionally or alternatively, aligning the set of building floorplan data with the building outline data of the target building may further comprise rotating the set of building floorplan data to minimize a difference in an area between the set of building floorplan data and the building outline data of the target building. In this aspect, additionally or alternatively, the set of building floorplan data may include building floorplan data for a plurality of floors, and aligning the set of building floorplan data with the building outline data of the target building may further comprise determining anchor points between the building floorplan data of the plurality of floors, joining the set of building floorplan data of the plurality of floors based on the determined anchor points, and aligning the joined set of building floorplan data with the building outline data of the target building. In this aspect, additionally or alternatively, the anchor points may be determined based on identifying elevators or stairs in the set of building floor plan data. In this aspect, additionally or alternatively, aligning the set of building floorplan data with the building outline data of the target building may further comprise receiving an alignment input from an authorized user of the tenant entity, and aligning the set of floorplan outline data with the building outline data of the target building based on the alignment input. In this aspect, additionally or alternatively, the alignment input may be selected from the group consisting of a translation alignment, a scaling alignment, and a rotation alignment. In this aspect, additionally or alternatively, the method may further comprise determining that a client computer device is authorized to access the set of building floor plan data stored on tenant bounded server system, and sending the set of building floor plan data and at least a portion of the platform map data to the client computer device to cause the client computer device to present a merged view of the set of building floorplan data and the portion of platform map data.

Another aspect provides a server system comprising a platform server system including one or more processors configured to execute a platform map service configured to store platform map data that is geospatially referenced. The server system further comprises a tenant bounded server system including one or more processors configured to store geospatially referenced building floorplan data for a tenant entity. The one or more processors of the server system are configured to determine that a client computer device is authorized to access the geospatially referenced building floor plan data stored on tenant bounded server system, and send the set of building floor plan data and at least a portion of the platform map data to the client computer device to cause the client computer device to present a merged view of the set of building floorplan data and the portion of platform map data.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A server system comprising:
a platform server system including one or more processors configured to execute a platform map service configured to store platform map data that is geospatially referenced and includes building outline data for one or more buildings, and provide the platform map data to client computer devices; and
a tenant bounded server system including one or more processors configured to store building floorplan data for a tenant entity, and provide building floorplan data to client computer devices that are authenticated for the tenant entity;
wherein the one or more processors of the tenant bounded server system are further configured to:
receive a set of building floorplan data for a target building included in the platform map data, the set of building floorplan data being associated with the tenant entity;
determine geospatial reference data for the set of building floorplan data by aligning the set of building floorplan data with building outline data of the target building; and
store the set of building floorplan data and the determined geospatial reference data in a tenant boundary of the tenant entity.

2. The server system of claim 1, wherein to align the set of building floorplan data with the building outline data of the target building, the one or more processors of the tenant bounded server system are further configured to:
determine a centroid of the building outline data of the target building and a centroid of the set of building floorplan data; and
translate the set of building floorplan data to align the centroid of the set of building floorplan data with the centroid of the building outline data of the target building.

3. The server system of claim 1, wherein to align the set of building floorplan data with the building outline data of the target building, the one or more processors of the tenant bounded server system are further configured to:
determine a perimeter ratio between a perimeter of the building outline data of the target building and a perimeter of the set of building floorplan data; and
scale the set of building floorplan data based on the perimeter ratio.

4. The server system of claim 1, wherein to align the set of building floorplan data with the building outline data of the target building, the one or more processors of the tenant bounded server system are further configured to:
rotate the set of building floorplan data to minimize a difference in an area between the set of building floorplan data and the building outline data of the target building.

5. The server system of claim 1, wherein the set of building floorplan data includes building floorplan data for a plurality of floors.

6. The server system of claim 5, wherein to align the set of building floorplan data with the building outline data of the target building, the one or more processors of the tenant bounded server system are further configured to:
determine anchor points between the building floorplan data of the plurality of floors;
join the set of building floorplan data of the plurality of floors based on the determined anchor points; and
align the joined set of building floorplan data with the building outline data of the target building.

7. The server system of claim 6, wherein the anchor points are determined based on identifying elevators or stairs in the set of building floor plan data.

8. The server system of claim 1, wherein to align the set of building floorplan data with the building outline data of the target building, the one or more processors of the tenant bounded server system are further configured to:
receive an alignment input from an authorized user of the tenant entity; and
align the set of floorplan outline data with the building outline data of the target building based on the alignment input.

9. The server system of claim 8, wherein the alignment input is selected from the group consisting of a translation alignment, a scaling alignment, and a rotation alignment.

10. The server system of claim 1, wherein a processor of the server system is configured to:
determine that a client computer device is authorized to access the set of building floor plan data stored on tenant bounded server system;
send the set of building floor plan data and at least a portion of the platform map data to the client computer device to cause the client computer device to present a merged view of the set of building floorplan data and the portion of platform map data.

11. A method comprising:
at one or more processors of a platform server system:
executing a platform map service configured to store platform map data that is geospatially referenced and includes building outline data for one or more buildings; and
providing the platform map data to client computer devices;
at one or more processors of a tenant bounded server system:
storing building floorplan data for a tenant entity; and
providing the building floorplan data to client computer devices that are authenticated for the tenant entity;
wherein at one or more processors of a tenant bounded server system, the method further comprises:
receiving a set of building floorplan data for a target building included in the platform map data, the set of building floorplan data being associated with the tenant entity;
determining geospatial reference data for the set of building floorplan data by aligning the set of building floorplan data with building outline data of the target building; and
storing the set of building floorplan data and the determined geospatial reference data in a tenant boundary of the tenant entity.

12. The method of claim 11, wherein aligning the set of building floorplan data with the building outline data of the target building further comprises:
determining a centroid of the building outline data of the target building and a centroid of the set of building floorplan data; and
translating the set of building floorplan data to align the centroid of the set of building floorplan data with the centroid of the building outline data of the target building.

13. The method of claim 11, wherein aligning the set of building floorplan data with the building outline data of the target building further comprises:
determining a perimeter ratio between a perimeter of the building outline data of the target building and a perimeter of the set of building floorplan data; and
scaling the set of building floorplan data based on the perimeter ratio.

14. The method of claim 11, wherein aligning the set of building floorplan data with the building outline data of the target building further comprises:
rotating the set of building floorplan data to minimize a difference in an area between the set of building floorplan data and the building outline data of the target building.

15. The method of claim 11, wherein the set of building floorplan data includes building floorplan data for a plurality of floors; and
wherein aligning the set of building floorplan data with the building outline data of the target building further comprises:
determining anchor points between the building floorplan data of the plurality of floors;
joining the set of building floorplan data of the plurality of floors based on the determined anchor points; and
aligning the joined set of building floorplan data with the building outline data of the target building.

16. The method of claim 15, wherein the anchor points are determined based on identifying elevators or stairs in the set of building floor plan data.

17. The method of claim 11, wherein aligning the set of building floorplan data with the building outline data of the target building further comprises:
receiving an alignment input from an authorized user of the tenant entity; and
aligning the set of floorplan outline data with the building outline data of the target building based on the alignment input.

18. The method of claim 17, wherein the alignment input is selected from the group consisting of a translation alignment, a scaling alignment, and a rotation alignment.

19. The method of claim 11, further comprising:
determining that a client computer device is authorized to access the set of building floor plan data stored on tenant bounded server system; and
sending the set of building floor plan data and at least a portion of the platform map data to the client computer device to cause the client computer device to present a merged view of the set of building floorplan data and the portion of platform map data.

20. A server system that includes a non-transitory computer-readable medium, where the non-transitory computer-readable medium includes instructions that, when executed by a processor, cause the processor to perform acts comprising:
- executing a platform map service configured to store platform map data that is geospatially referenced and includes building outline data for one or more buildings;
- providing the platform map data to client computer devices;
- storing building floorplan data for a tenant entity; and
- providing the building floorplan data to client computer devices that are authenticated for the tenant entity;
- receiving a set of building floorplan data for a target building included in the platform map data, the set of building floorplan data being associated with the tenant entity;
- determining geospatial reference data for the set of building floorplan data by aligning the set of building floorplan data with building outline data of the target building; and
- storing the set of building floorplan data and the determined geospatial reference data in a tenant boundary of the tenant entity.

* * * * *